(12) United States Patent
Funaki et al.

(10) Patent No.: US 7,453,340 B2
(45) Date of Patent: Nov. 18, 2008

(54) SUPERCONDUCTING WIRE AND SUPERCONDUCTING COIL EMPLOYING IT

(75) Inventors: Kazuo Funaki, 1-7, Midorigaoka 1-Chome, Higashi-Ku, Fukuoka (JP) 813-0021; Masataka Iwakuma, 26-402, Shimoori-Danchi, Ohnojo-Shi, Fukuoka (JP) 816-0951; Takanobu Kisu, 3-15-35, Hiewa, Chuo-Ku, Fukuoka-Shi (JP) 812-0016; Akira Tomioka, Kanagawa (JP); Toshio Uede, Chiyoda-ku (JP); Hiroshi Fuji, Tokyo (JP); Teruo Izumi, Tokyo (JP); Yuh Shiohara, Tokyo (JP)

(73) Assignees: International Superconductivity Technology Center, The Juridical Foundation, Tokyo (JP); Fuji Electric Systems Co., Ltd., Tokyo (JP); Fujikura Ltd., Tokyo (JP); Kazuo Funaki, Fukuoka (JP); Masataka Iwakuma, Fukuoka (JP); Takanobu Kisu, Fukouka (JP)

( * ) Notice: Subject to any disclaimer, the term of this patent is extended or adjusted under 35 U.S.C. 154(b) by 312 days.

(21) Appl. No.: 10/514,194

(22) PCT Filed: Jul. 13, 2004

(86) PCT No.: PCT/JP2004/009965

§ 371 (c)(1),
(2), (4) Date: Aug. 22, 2005

(87) PCT Pub. No.: WO2005/008687

PCT Pub. Date: Jan. 27, 2005

(65) Prior Publication Data
US 2006/0077025 A1  Apr. 13, 2006

(30) Foreign Application Priority Data
Jul. 17, 2003 (JP) ............................ 2003-198235

(51) Int. Cl.
*H01B 12/06* (2006.01)
*H01B 13/00* (2006.01)
*H01F 6/00* (2006.01)

(52) U.S. Cl. .................. 335/216; 174/125.1; 505/230; 505/704; 505/705; 505/879; 505/884; 505/887

(58) Field of Classification Search ......... 505/230–232, 505/704, 705, 879, 880, 884, 886, 887; 335/216; 174/125.1; 336/DIG. 1
See application file for complete search history.

(56) References Cited

U.S. PATENT DOCUMENTS 5,168,259 A  12/1992 Yasuhiko

FOREIGN PATENT DOCUMENTS

EP  07-073757  3/1995

(Continued)

*Primary Examiner*—Ramon M Barrera
(74) *Attorney, Agent, or Firm*—Young & Thompson

(57) ABSTRACT

Tape-shaped superconducting wires, and a superconducting coil formed from said wires, wherein a plurality of electrically separated superconducting film parts, each having a rectangular cross section and arranged in parallel, form parallel conductors, providing superconducting wires capable of containing losses incurred in the presence of alternating current (A/C). A superconducting coil is made by winding the superconducting wires, wherein the coil structure contains at least a part wherein perpendicular interlinkage magnetic fluxes acting among conductor elements of the parallel conductors by the distribution of magnetic fields generated by the superconducting coils cancel mutually in order to contain circulating current within the wires and to make shunt current uniform, thereby providing a low-loss A/C superconducting coil.

13 Claims, 10 Drawing Sheets

FOREIGN PATENT DOCUMENTS

| | | |
|---|---|---|
| JP | 63-269422 | 11/1988 |
| JP | 03-222212 | 10/1991 |
| JP | 07-037444 | 2/1995 |
| JP | 11-135318 | 5/1999 |
| JP | 11-273935 | 10/1999 |
| JP | 2001-110256 | 4/2001 |
| WO | 96/12288 | 4/1996 |

[Fig. 1]
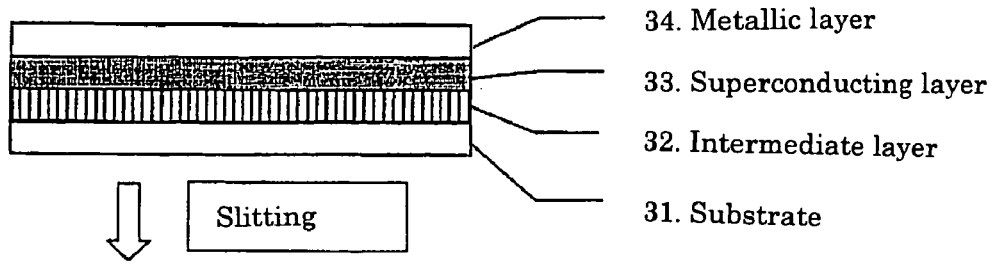
(a)
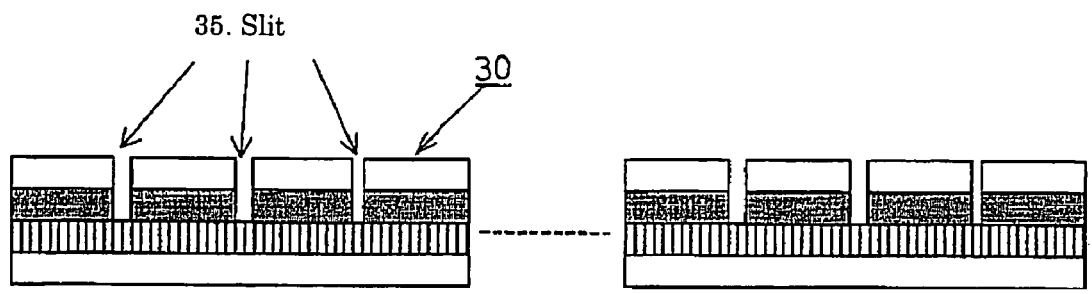
(b)
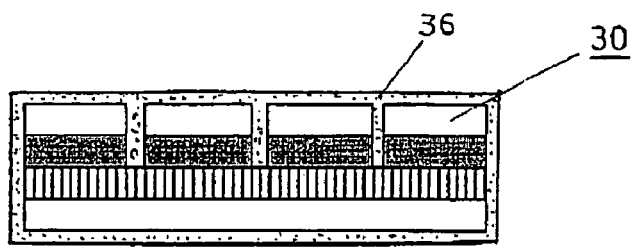
(c)

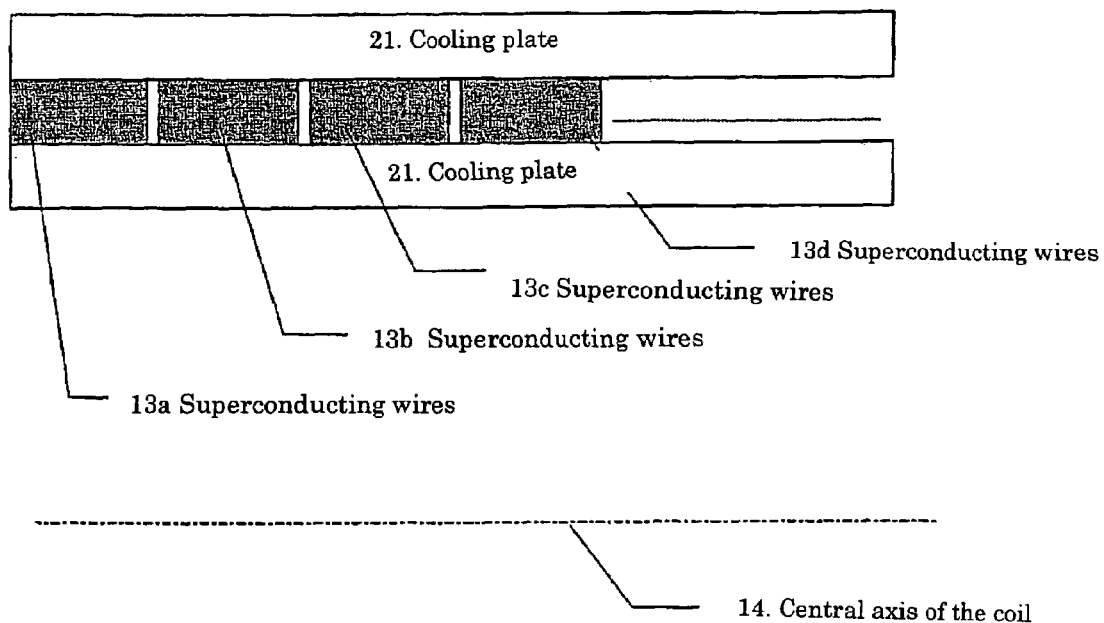
[Fig. 2]

[Fig. 3]
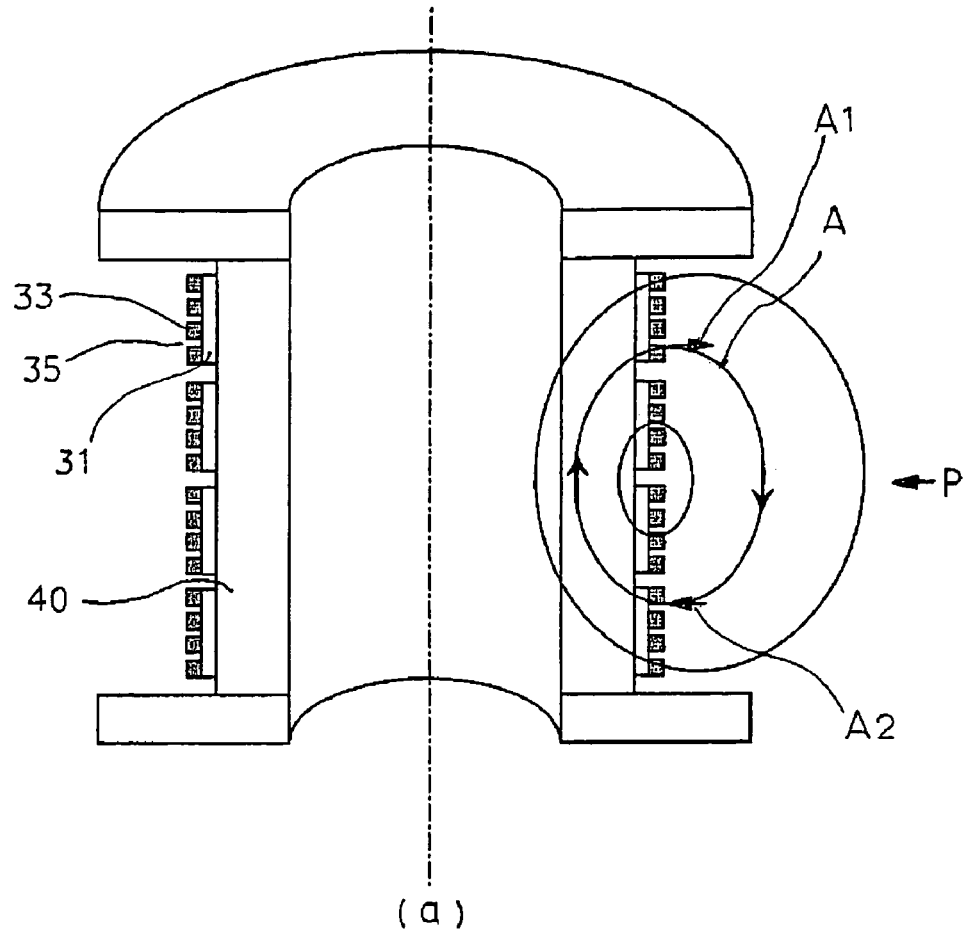
(a)
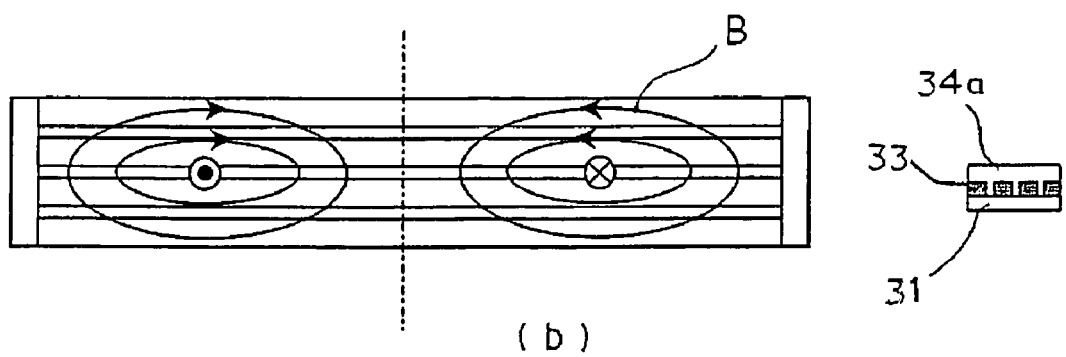
(b)
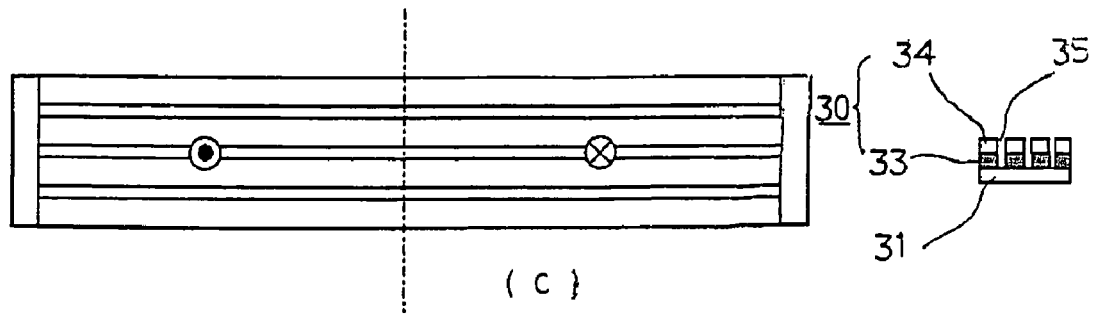
(c)

[Fig. 4]
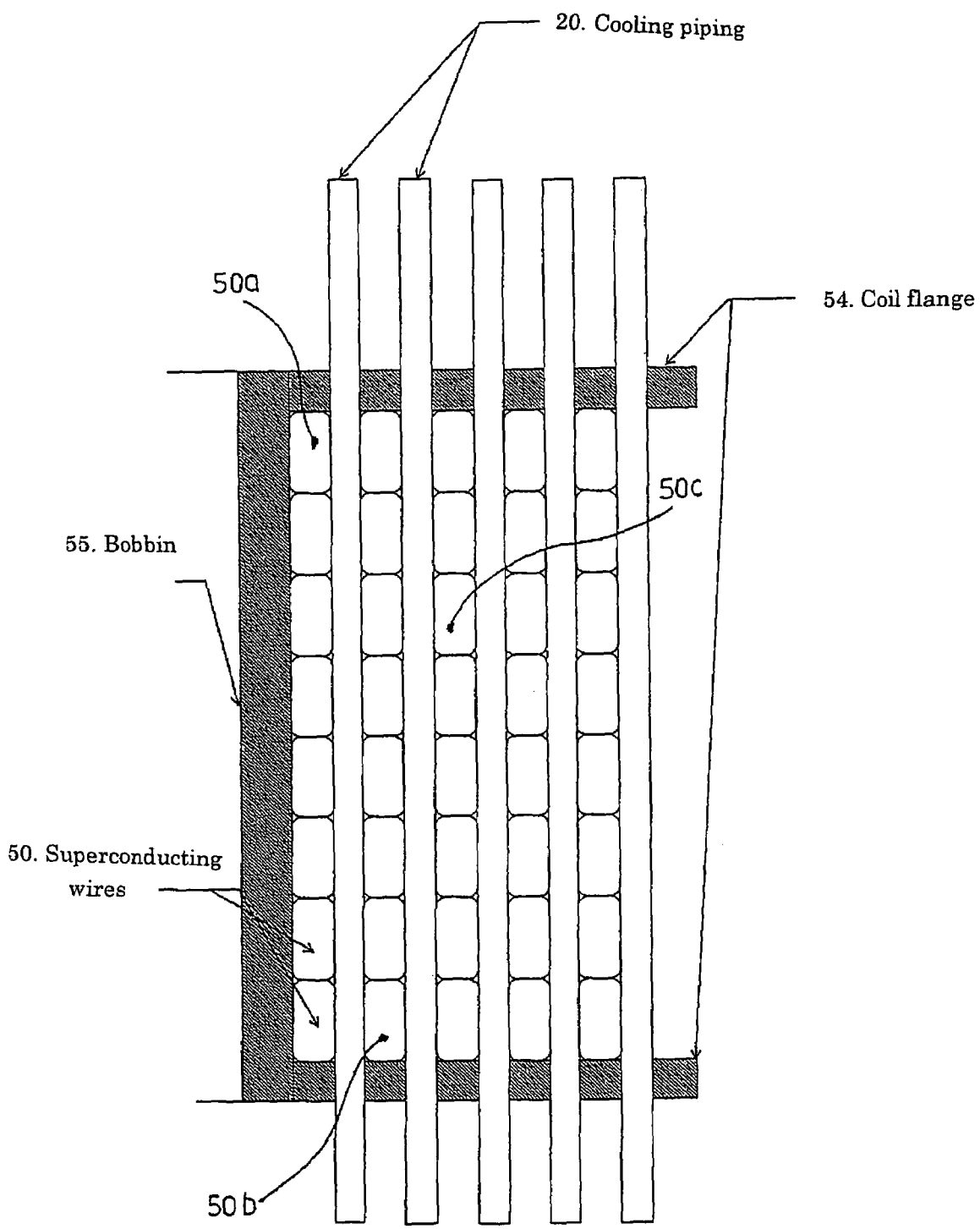

[Fig. 5]
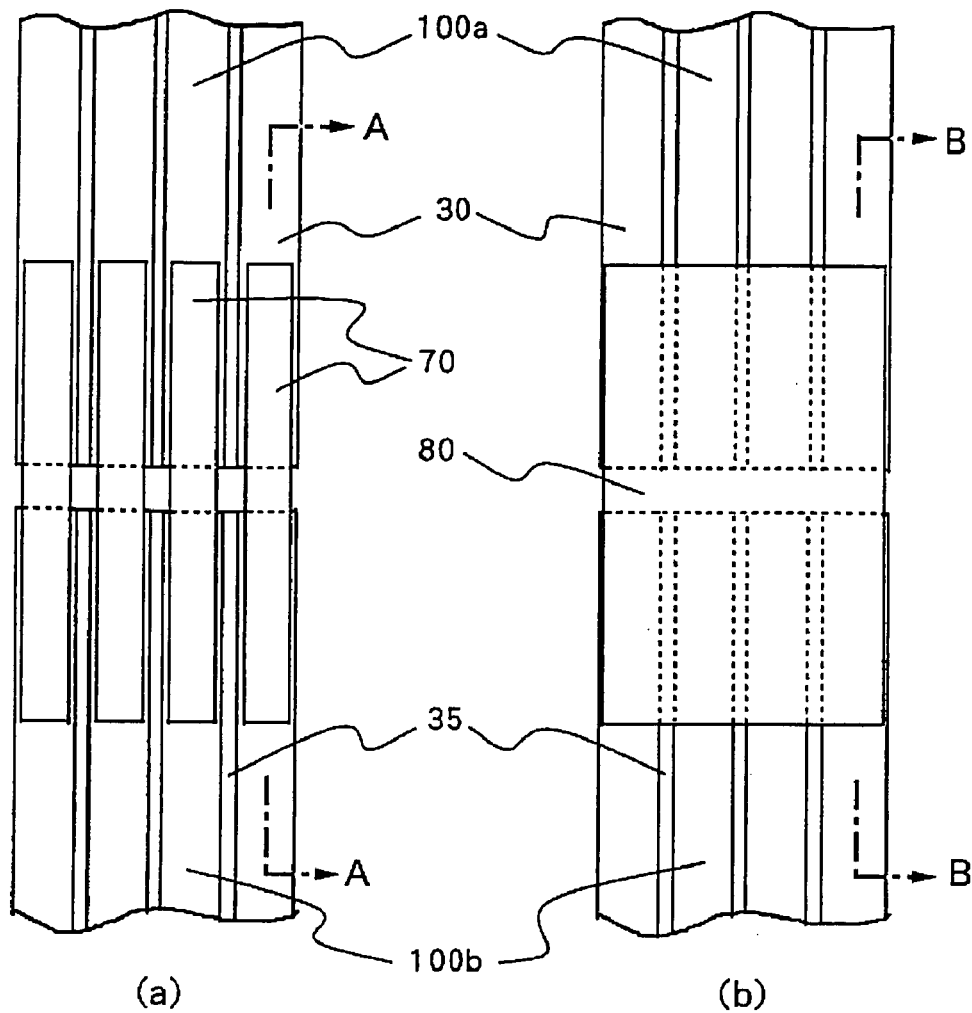

[Fig. 6]
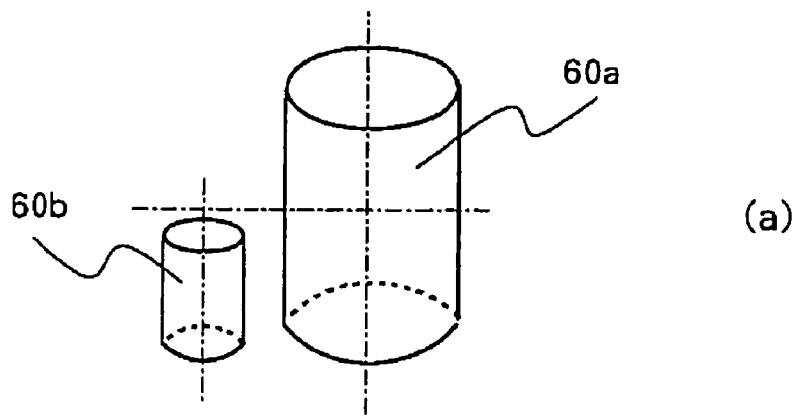
(a)
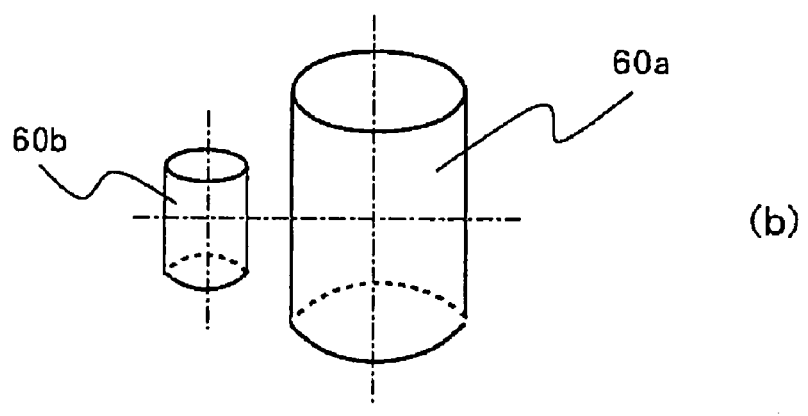
(b)
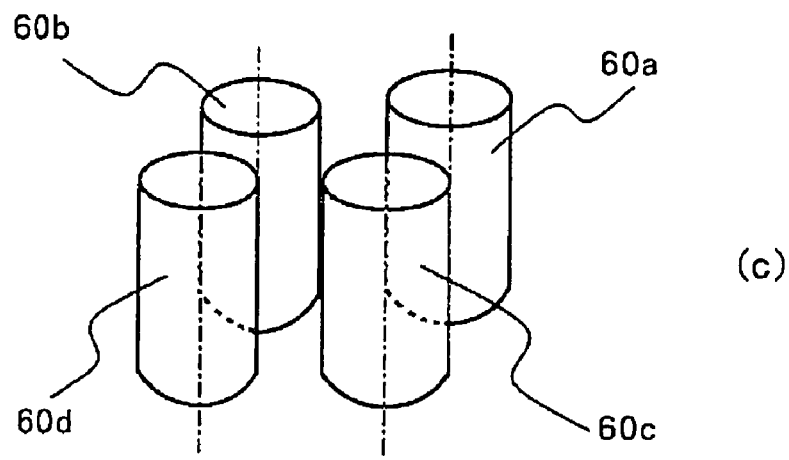
(c)

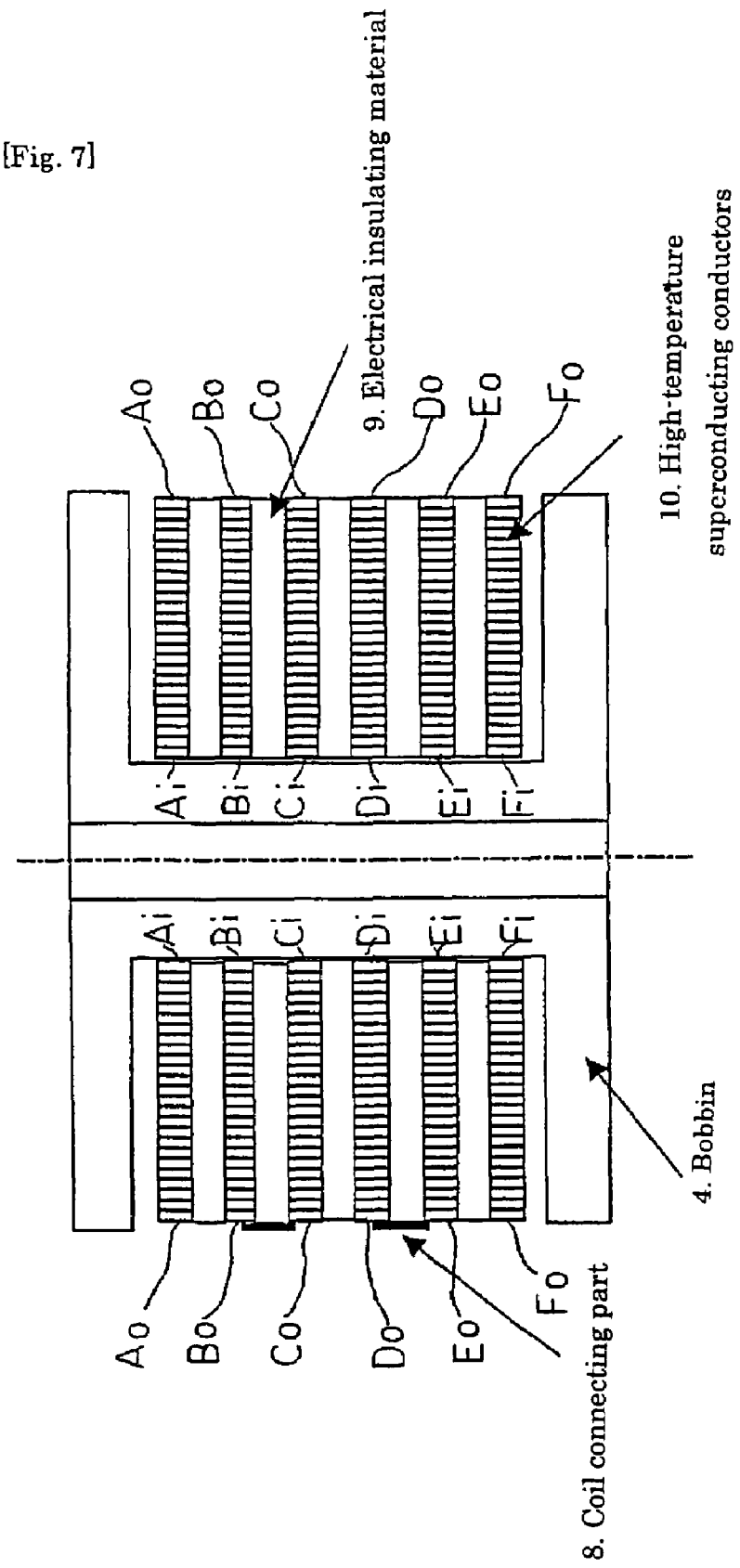

[Fig. 8]
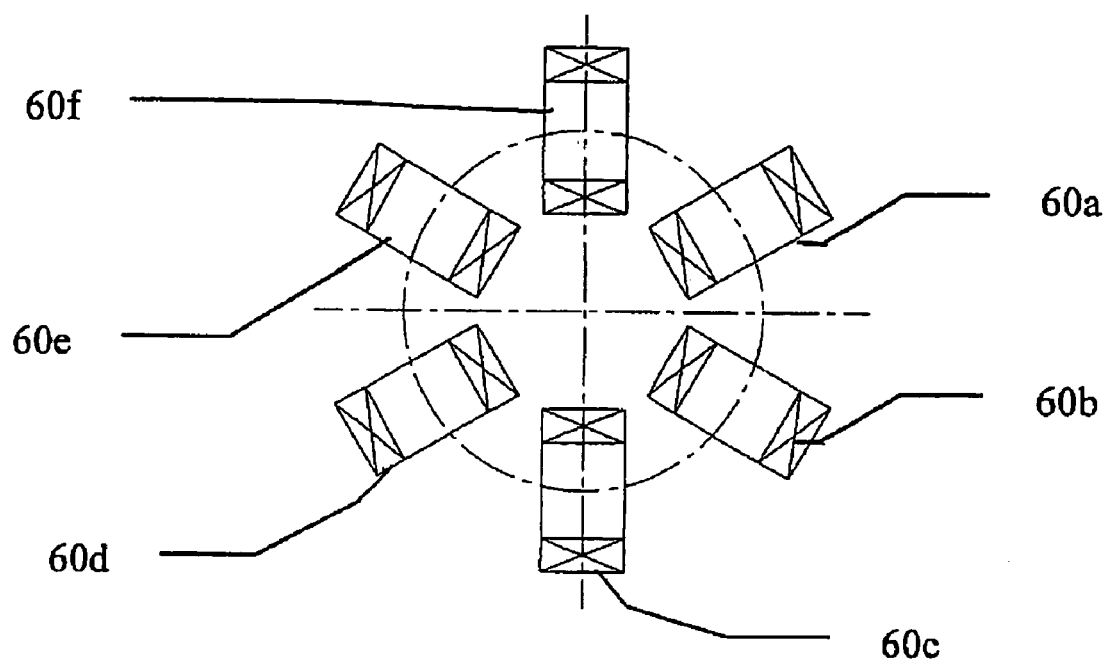

[Fig. 9]
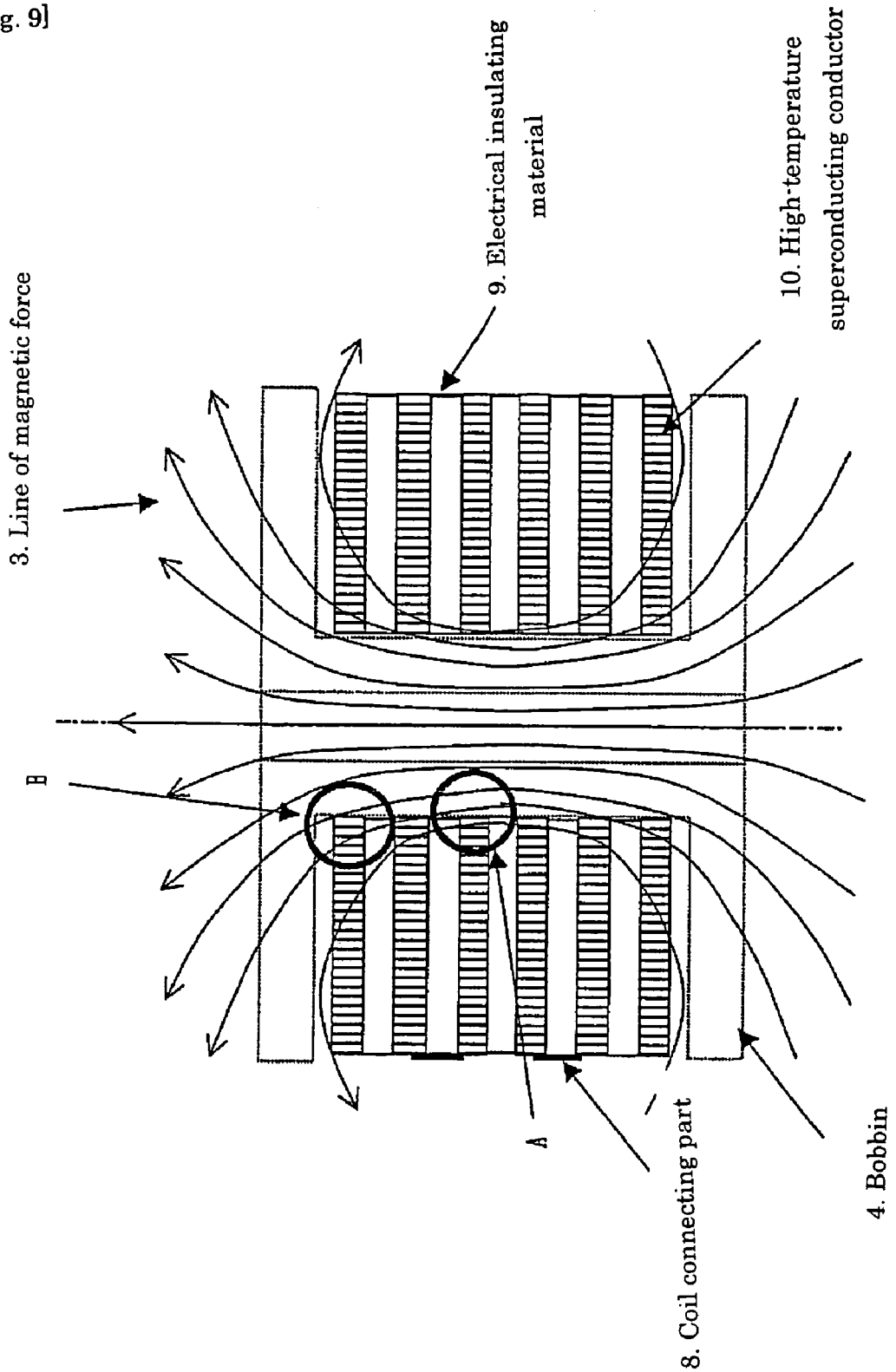

[Fig. 10]
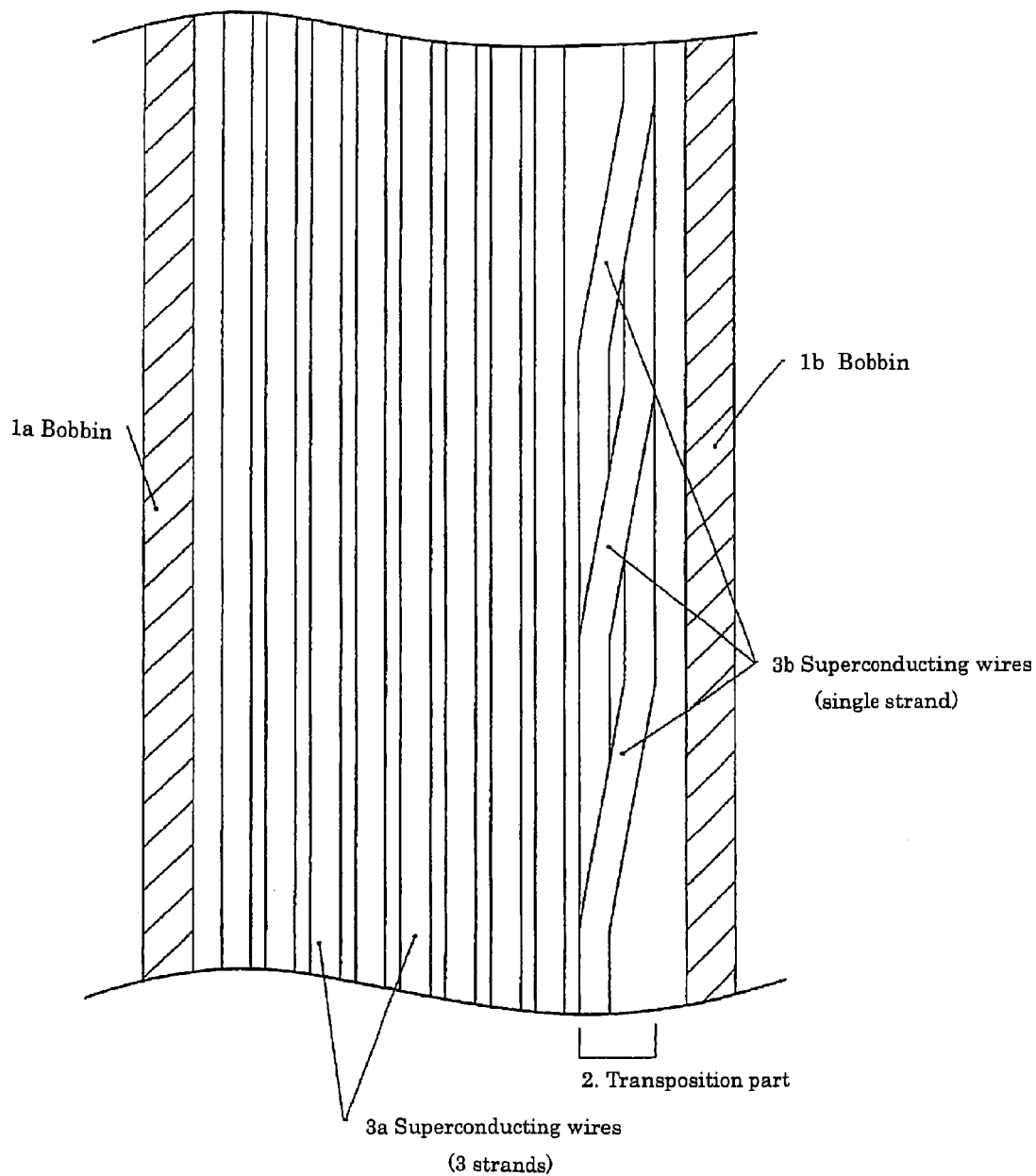

SUPERCONDUCTING WIRE AND SUPERCONDUCTING COIL EMPLOYING IT

TECHNICAL FIELD

The present invention relates to a superconducting wire and a superconducting coil made therewith used in electric machinery and apparatuses in which current changes rapidly, for example storage of energy, magnetic field application, electric transformers, reactors, motors, electric generators and the like.

BACKGROUND ART

The superconducting coil has been put to practical use in various fields as a means of generating high magnetic fields. On the other hand, the practical application of superconducting coils to A.C. devices such as transformers and reactors has witnessed little progress due to the phenomenon of losses incurred by superconducting conductors in the presence of AC.

However, since the recent development of a superconducting conductor having a small loss of AC by the thinning of superconducting stranded wires, a progress has been made in the researches for its application to transformers and other A.C. devices, and various proposals have been made on the structure of superconducting coils made thereof.

As superconducting conductors for this case, a superconducting wire made of a metal superconductor that remains in a superconducting state at a very low temperature of 4K at which liquid helium evaporates is mainly used as a practical superconducting material. Recently, however, efforts are being made to develop superconducting coils based on an oxide superconductor. This oxide superconductor is also called "a high-temperature superconductor." The use of this high temperature superconductor is more advantageous than the use of metallic superconductors in that the operating cost is low (see patent references 1-4 indicated below).

By the way, when a plurality of conductors are used in parallel for example in a transformer or other A.C. devices in which current changes rapidly, conductors are transposed. The relative positions of a plurality of conductors are changed to reduce the interlinkage magnetic flux between the respective conductors, or reduce induced voltage resulting therefrom and thereby make the current distribution for the respective conductors uniform.

The differences in induced voltage between respective parallel conductors resulting from the magnetic flux generated by current induces circulating current. In the case of ordinary conductors such as copper or aluminum, however, impedance consists mainly of resistance component and the circulating current has a phase deviating by approximately 90° in relation to the load current. For this reason, even if a 30% circulating current is generated, the current flowing in a conductor is the vector sum of 100% of the load current and a 30% circulating current having a phase difference of 90° thereto, and therefore, the absolute value thereof which is the square root of the sum of respective squares amounts to approximately 105%. Thus, the increase in the value of current is small for the circulating current. When a superconducting wire is used as a conductor, on the other hand, as resistance is practically zero in the superconducting state, impedance that determines circulating current is mostly determined by inductance. Therefore, the circulating current takes the same phase as current, and if the circulating current is 30%, this circulating current is added to the current and as a result a 130% current flows in the superconductor. When this current value reaches the critical current level, the loss of AC increases or drift increases. In such a coil consisting of superconducting wires, it is very important to control the circulating current. Although it is possible to contain circulating current in a superconducting conductor by changing the relative position of conductors, in the case of oxide superconducting wires which are by nature weaker than alloy superconductors to the bending force, there is an allowable bending radius for displaying their capacity, and it is necessary to pay the maximum attention to the work of transposition. Therefore, the more numerous is the number of parallel conductors is, in other words, the more numerous is the number of transposing parts, it takes longer time to do the work and the whole project becomes more costly. And even if sufficient attention is paid to the transposition part, due to the deflection of superconducting wires, it is unavoidable that such parts would be unstable, and such unstable parts become more numerous as the number of transposition parts increases.

In a superconducting transformer in which there are only a limited number of coil layers, where there are rooms between layers and the coil diameter is large, the countermeasures taken against the unstable parts are easy, and the conventional transposition method is enough. However, in the case of coils for storage of energy or those for magnetic field application, due to a large number of coil layers and the requirement for keeping the layers in close contact, the space for taking countermeasures against the unstable parts will be limited. Therefore, the impacts of the countermeasures against the unstable parts may affect other upper and lower layers or contiguous superconducting wires. And not only there is a risk of being unable to meet the required specifications but also the problem of being unable to keep stable operation.

The structure of a superconducting coil designed to solve the problems described above, to reduce the number of transposition parts as unstable parts while containing circulating current, and to reduce the costs by simplifying the transposition work is disclosed for example in Patent Reference 1.

The summary of the invention described in Patent Reference 1 is as follows. Specifically, "in a superconducting coil in which a plurality of superconducting wires are arranged in parallel and wound, it is possible to reduce the number of transposition parts, contain the circulating current and at the same time reduce the unstable parts by adopting a structure in which the relative positions are changed only at the ends of coil, and in addition by making the number of coil layers an integral multiple of 4 times the number of superconducting wires arranged in parallel (4 times the number of wires ). As a result, the work and time for transposition is reduced resulting not only in lower costs, but also fewer unstable parts and thus enabling to contain circulating current. Therefore, it is possible to obtain an advantage of being able to excite and demagnetize at a high speed and stably".

FIG. 10 is an example of the transposition structure of a superconducting coil described in FIG. 1 of Patent Reference 1. In FIG. 10, for winding three superconducting wires 3a superposed in the radial direction of the coil by winding in the direction of bobbin 1a-bobbin 1b, at the start of the coil on the 1a side of bobbin, the superconducting wires 3a are wound for multiple layers and from the internal diameter of the coil, for example, in the order of (A1, A2, and A3) not shown, and at the transposition part 2 at the end of the coil, at first (A3) is bent at the following turn, and the transposition work is carried out on (A2, and A1) in the same manner, so that at the end of the coil on the 1b side of the bobbin, the coil will be arranged for example in the order of (A3, A2, and A1). By making the arrangement described above, the number of transposition parts and bending of coil will be reduced in comparison with the prior transposition structure described in FIG. 4 of Patent Reference 1 and the work will be considerably simplified thereby.

Regarding an example of the structure mentioned above on a number of coil layers equal to an integral multiple of four times the number of superconducting wires arranged in parallel (4 times the number of wires), the description is omitted here (for the details, see Patent Reference 1.)

In the superconducting coil described above, on the other hand, a structure in which the generation of heat subsequent to the A.C. loss is effectively removed and a stable operation is assured without causing any normal conduction transition is required. As a structure preferable from this viewpoint, Patent Reference 2 discloses "a superconducting coil having a heat transmission cooling plate made of a material with high thermal conductivity between layers of superconducting coils wound on the peripheral surface of a cylindrical bobbin made of an electric isolating material constituting cylindrical layers."

And as a preferable production method of the oxide superconducting wire (a high temperature superconducting wire)of a high productivity described above, a possible method is, for example, that of forming a film of oxide superconducting material on a flexible tape substrate. And production methods based on the vapor phase deposition method such as laser ablation method, CVD method, etc. are now being developed. Oxide superconducting wires made by forming an oxide superconducting film on the tape substrate as described above have an exposed superconducting film on the outermost layer, and no stabilization treatment has been applied on the surface of the exposed side. As a result, when a relatively strong current is given to such an oxide superconducting wire, the superconducting film transits locally from the superconducting state to the normal conducting state due to the local generation of heat, resulting in an unstable transmission of current.

For the purpose of solving the problems mentioned above, and providing an oxide superconductor having a high critical current value, capable of transmitting current with stability and whose stability does not deteriorate even after an extended period of storage and the method of producing the same, the Patent Reference 3 discloses a following tape-shaped superconducting wire.

Specifically, "a superconducting wire comprises of an intermediate layer formed on a flexible tape substrate, an oxide superconducting film formed on the intermediate layer, and a gold or silver film (a metal normal conduction layer) 0.5 μm or more thick formed on the oxide superconducting film." And example of embodiment described in Patent Reference 3 reads as follows. "On "Hastelloy" tape serving as the substrate, an yttria stabilized zirconia layer or magnesium oxide layer is formed as an intermediate layer. On top of this layer, Y—Ba—Cu—O oxide superconducting film is formed. And on this layer, a gold or silver coating film is formed."

And for the purpose of effectively dissipating the heat generated by AC loss and for improving thermal stability by forming a normal conductance metallic layer, Patent Reference 4 discloses the method of producing superconducting wires in the form of a tape having the following structure. The Japanese patent application laid open describes as follows: "A method of producing high temperature superconducting wires wherein said high temperature superconducting film of a tape-shaped material made by coating a high temperature superconducting film on the substrate surface is irradiated on the longitudinal direction by one or more long-wave laser beam arranged horizontally by intervals to deprive its superconductivity (change into normal conductor) the irradiated part, and at the same time the width of the superconducting parts located between said non-superconducting parts is controlled by the non-irradiation of long wavelength laser beam by choosing the beam diameter and the distance between said plurality of long-wave laser beams."

Patent Reference 1: Japanese Patent Application Laid Open 11-273935 (p. 2-4, FIGS. 1-4)

Patent Reference 2: Japanese Patent Application Laid Open 11-135318 (p. 2-4, FIG. 3)

Patent Reference 3: Japanese Patent Application Laid Open 7-37444 (p. 2-7, FIG. 1)

Patent Reference 4: Japanese Patent Application Laid Open 3-222212 (p. 1-2, FIG. 3)

When mass-produced tape-shaped superconducting wires like the ones described in Patent References 3 and 4 mentioned above are used in an A.C. device, the A.C. loss that develop in the superconducting wires will be, due to the form anisotropy of flat tapes, dominated by those in the perpendicular magnetic field acting in the perpendicular direction upon the flat surface of the tape. This is because demagnetization that accompanies changes in the magnetic field, in other words, the magnetic momentum m for canceling the magnetic field is the product of multiplying the shielding current i by the average distance d of the shielding current, and therefore in the case of the flat tape shape, the average distance d of the flat surface is far greater than that in the thickness direction of the tape, and the magnetic momentum m will be far greater in the perpendicular magnetic field acting upon the flat surface.

Therefore, in order to reduce A.C. loss, how the perpendicular magnetic field loss can be reduced, or how the shielding current i and the average distance d of the shielding current on a flat surface can be reduced will be a problem. From this viewpoint, the structural separation of the superconducting film part of the tape-shaped superconducting wires will be effective to reduce the average distance d mentioned above. However, in the case of the superconducting wires described in Patent Reference 4, the normal conducting film part and the superconducting film part are alternately formed and therefore eddy current losses develop in the normal conducting film part to amplify the losses.

When a superconducting coil is made by using mass-produced tape-shaped superconducting wires described in Patent References 3 and 4 above, it is difficult in view of the structure of the superconducting wires to change the relative positions described in Patent Reference 1, and even if such transpositions are carried out, instability resulting from the transpositions increases.

Therefore, when tape-shaped superconducting wires are used, it is preferable to adopt a structure of not causing changes in the positions, making shunt current uniform and of containing circulating current. And as for the structure of coil, it is preferable, from the viewpoint of the structure or arrangement of the superconducting coil, to adopt a structure that cancels the perpendicular interlinkage magnetic flux that acts on the superconducting wires in order to reduce A.C. loss due to shielding current. Moreover, it is preferable to adopt a structure that makes it possible to cool down the superconducting wires as uniformly as possible and to increase the current-carrying capacity thereof.

The present invention has been made in view of the points described above, and the objects of the present invention are to provide a superconducting wire capable of containing A.C. loss and a low-loss superconducting coil made from this superconducting wire having a simple structure without transposition, capable of canceling interlinkage magnetic flux due to the perpendicular magnetic field to the wire, and capable of containing the circulating current within the wire due to the perpendicular magnetic field and making shunt current uniform so that the losses may be limited.

DISCLOSURE OF THE INVENTION

In order to solve the problems mentioned above, the present invention separates electrically at least the superconducting film part into a plurality of superconducting films having a rectangular cross section to form parallel conductors in tape-shaped superconducting wires made by forming a superconducting film on the substrate (the invention according to claim 1).

By the above arrangement the details of which will be described later, parallel conductors formed by arranging a plurality of superconducting films in parallel function as multifilament superconductors, shunt current will be made uniform and at the same time in the case of application to the coils for A.C. devices, A.C. loss in the perpendicular magnetic field can be reduced. As described above, the tape-shaped superconducting wires disclosed in the Patent Reference 4 above are structurally separated their superconducting film part. Due to the alternate formation of the normal conducting film part and the superconducting film part, however, an eddy current loss will develop in the normal conducting film part, and the loss may increase. However, according to the superconducting wires of the present invention mentioned above, due to the electrical separation of various conductor elements of parallel conductors, no problem like the ones described in Patent Reference 4 above will arise. With regard to the rectangular cross section described above, and there can be various variations depending on the cases such as trapezoid shape, or chamfered rectangular or trapezoid shape although this may depend on the manufacturing process used.

As the embodiment for the invention according to claim 1 above, the inventions described in claims 2-4 are preferable. Specifically, the superconducting wires according to claim 1 above wherein a normal conducting metal layer is formed on the superconducting film formed on the substrate, and the parallel conductors electrically separate both the metallic layer and the superconducting film in order to arrange them in parallel (invention according to claim 2). This structure enables to contain the A.C. loss and to improve thermal stability.

And in the superconducting wires according to claims 1 or 2 above, the parts that electrically separate the parallel conductors are slit-shaped grooves, which is filled with an electrically insulating material, and the whole environment around the parallel conductors is coated with an electrical insulating material (invention according to claim 3). The slit-shaped grooves formed by, for example, laser machining or etching, filled with epoxy resin or other electrically insulating materials, and the whole environment around the parallel conductors coated with an electrically insulating material can easily make up electrically insulated and electrically more stable parallel conductors. And from the viewpoint of reducing the operating cost of a superconducting coil made by using the superconducting wires, the superconducting film in the superconducting wires described in any one of claims 1 to 3 will be a high temperature superconducting film (invention according to claim 4).

Then, regarding the invention of superconducting coil, the inventions according to claims 5-9 described below are preferable. Specifically, a superconducting coil formed by winding superconducting wires according to any one of claims 1-4, in view of the structure and arrangement of the superconducting coil, has a coil structure with at least partially a part where the perpendicular interlinkage magnetic flux acting upon various conductor elements of the parallel conductors acts to cancel each other by the distribution of magnetic field generated by the superconducting coil '(invention according to claim 5).

It is preferable that the part where the perpendicular interlinkage magnetic flux acts to cancel each other would extend over the whole superconducting wires constituting the superconducting coil. However, since the production length of the superconducting wires is limited, the electric connection part of the superconducting wires excluding small coil is often necessary. Even in that case, a structure in which the parts acting to cancel each other would be as many as possible is desirable.

And in the superconducting coil according to claim 5 above, the superconducting wires is wound one or more turns in the axial direction of the coil and one or more turns in the radial direction of the coil (invention according to claim 6). The winding method of the superconducting coil includes a cylinder winding method, a pancake winding method, and a saddleback winding method. In any of these winding methods, it is preferable to adopt a structure wherein the parts where the perpendicular interlinkage magnetic flux acting upon various conductor elements of the parallel conductors acts to cancel each other would be as many as possible. The details will be described later.

The inventions according to claim 7 to 8 below are inventions of preferable embodiments respectively in the cylinder winding method and the pancake winding method. Specifically, in the superconducting coil according to the claim 6 above, the superconducting coil is a coil made by the cylinder winding method, and at least an electric connecting part by the bundle connection method of superconducting wires is provided on a part of the coil axis to which various conductor elements of the parallel conductors of the superconducting wires are connected in a bundle, the electrical connection part shall be provided at the coil axis end (invention according to claim 7).

The possible electric connection methods of superconducting wires, as the details described below show, include a bundle connection method of the superconducting wires in which various conductor elements of the parallel conductors of the superconducting wires are connected in a bundle and a separate connection method of conductor elements in which various conductor elements of parallel conductors are respectively electrically separately connected. From the viewpoint of production of coils, the bundled connection method is easier, and if this method is to be adopted for the electrical connection part, as described in the invention according to claim 7 above, the provision of the electrical connection part at the coil axis end enables to cancel in fact entirely the perpendicular interlinkage magnetic flux due to the symmetry of the coil axis direction. If the separate connection method of the conductor elements is to be adopted, it is not necessary to limit the connection part to the coil axis end. And whatever position of the coil may be chosen for connection, the perpendicular interlinkage magnetic flux can be cancelled. The details will be described below.

And if the superconducting coil is a coil made by the pancake winding method in the superconducting coil according to claim 5 above, a plurality of said coil connection parts for connecting two pancake coils are provided on the inside and outside periphery of the coil, and at least a part of said coil connecting parts are the ones according to the separate connection method in which various conductor elements of the parallel conductors of said superconducting wires are electrically separately connected respectively, and the remaining coil connection parts are the ones according to the bundled connection method for superconducting wires, and the coil connecting parts are provided on the inside and outside periphery of the coil so that as a whole the interlinkage magnetic flux of the perpendicular magnetic field acting among various conductor elements of the parallel conductors of each pancake coil may cancel each other (invention according to claim 8).

In the case of a coil made by the pancake winding method, generally a coil connection part is provided between the peripheral surfaces of two contiguous coil pancakes. In this case, it is impossible to cancel mutually interlinkage magnetic flux. According to the invention described in claim 8 above, however, it is possible in fact to cancel the perpendicular interlinkage magnetic flux as a whole. The details will be described later.

And in the case of a superconducting coil made by winding a plurality of layers in the superconducting coil according to any one of claims 5 to 8 above, cooling plates made of a good thermal conductive material are inserted among at least some of the layers (invention according to claim 9). This arrangement enables to improve the thermal stability of superconducting coils. Incidentally, the cooling method of superconducting coils is not limited to the disposition of cooling plates in which a very low temperature liquid or gas is circulated for cooling as described above. Instead, for example, the whole coil may be dipped in a tank of liquid nitrogen for cooling.

BRIEF DESCRIPTION OF DRAWINGS

[FIG. 1] A typical cross-sectional view of superconducting wires showing an embodiment of the present invention.

[FIG. 2] A typical structure of a superconducting coil showing an embodiment of the present invention in which cooling plates are disposed.

[FIG. 3] A typical descriptive illustration of a superconducting coil related with the present invention wherein the wire is wound a turn in the coil axis direction and the magnetic flux formed in the coil.

[FIG. 4] A descriptive illustration of the electrical connection part of a superconducting coil according to the cylinder winding method related with the present invention.

[FIG. 5] A descriptive illustration of the electrical connection method of superconducting wires related with the present invention.

[FIG. 6] A descriptive illustration showing the disposition of a superconducting coil according to the cylinder winding method related with the present invention.

[FIG. 7] A descriptive illustration of the electrical connection part of a superconducting coil according to a pancake winding method related with the present invention.

[FIG. 8] A descriptive illustration of toroidal arrangement of a superconducting coil related with the present invention.

[FIG. 9] An illustration showing the typical structure of a superconducting coil according to the conventional pancake winding method and the distribution of the magnetic field thereof.

[FIG. 10] An illustration showing an example of transposition structure of the superconducting coil described in Patent Reference 1.

EXPLANATION OF CODES

13*a*-13*d*, 50 Superconducting wire
14 Central axis of a coil
21 Cooling plate
30 Conductor elements
31 Substrate
32 Intermediate layer
33 Superconducting layer
34 Metallic layer
35 Slit
36 Electric insulation material
60*a*-60*d* Superconducting coil
70 Connecting member for conductor elements
80 Bundled connecting member for conductor elements
100*a*, 100*b* Superconducting wire

THE BEST MODE FOR CARRYING OUT THE INVENTION

The embodiments of the present invention will be described with reference to drawings. In the first place, the basic structure of the superconducting wire of the present invention and the application of this wire to superconducting coils will be described with reference to FIGS. 1 and 2.

FIG. 1 is a typical cross-sectional view of superconducting wire showing an embodiment of the present invention and shows the structure of parallel conductors of which the superconducting film is split into four parts. FIG. 1(*a*) shows the superconducting conductor before its split, FIG. 1(*b*) shows the parallel conductor after the split by slitting. And FIG. 1(*c*) shows the parallel conductors after a coating for insulation.

In FIG. 1, 31 represents the substrate, 32 represents the intermediate layer, 33 represents the superconducting layer, 34 represents the metallic layer, 35 represents slits as splitting grooves, and 36 represents electrical insulating material. On the other hand, the group number 30 represents conductor elements consisting of the split metallic layer and the superconducting layer. The superconducting conductor before splitting shown in FIG. 1(*a*) consists of, for example, Hastelloy tape for the substrate 31, on which intermediate layer 32 is formed as an electric insulation layer, on which Y—Ba—Cu—O oxide superconducting film is formed as a superconducting layer 33, and on which for example a gold or silver coating layer is formed as a normal conducting metallic layer 34. Incidentally, as the intermediate layer 32 described above, a double-layered structure consisting of, for example, a cerium oxide ($CeO_2$) layer formed on a gadolinium zirconium oxide ($Gd_2Zr_2O_7$) layer is formed.

The superconducting conductor is, as shown in FIG. 1(*b*), slit in the longitudinal direction of the superconducting conductor, and as shown in FIG. 1(*c*) epoxy resin, enamel and other flexible electric insulation materials 36 are filled in the groove formed by slitting and over the entire environment around the conductors to form parallel conductors. In applying the superconducting wires as described above to the superconducting coil, the superconducting wires consisting of the parallel conductors are, as shown in FIG. 1(*b*), wound in the form of a cylindrical layer on the peripheral surface of a cylindrical bobbin made of an electrical insulation material not shown around the central axis of coil 14. Although the intermediate layer 32 is not slit in FIGS. 1(*b*) and 1(*c*), the slit 35 may be extended to the intermediate layer 32. In this case, it is preferable to fill the extended part with the electrical insulation material 36 together with other parts.

And now FIG. 2 will be explained. FIG. 2 is related with a superconducting coil made by winding the superconducting wire shown in FIG. 1 for a plurality of turns in which cooling plates 21 made of a good conductive material is disposed between the layers described above. In FIG. 2, the superconducting wires 13*a*-13*d* shows typically various segments split into four parts of the parallel conductors in FIG. 1(*b*).

Then, we will describe the structure and the principle of operation of the embodiment related to the invention of the superconducting coil. In the first place, we will deal with coils according to the cylinder winding method (solenoid coil). FIG. 3 is a typical illustration of a superconducting coil made by winding for a turn in the radial direction of the coil the parallel conductors split into four parts described above and the magnetic flux formed on the coil.

FIG. 3(a) shows a typical state chart of the magnetic flux line in a cross-sectional view of the superconducting coil, and FIGS. 3(b) and 3(c) show a typical state chart of the magnetic flux line in the parallel conductor part split into four parts as seen from the arrow P direction of FIG. 3(a). FIG. 3(b) shows comparative examples that can be obtained when the superconducting layer as the one disclosed in Patent Reference 4 is slit but the surface is electrically connected, and FIG. 3(c) shows an embodiment of the present invention in which the superconducting layer is slit and electrically insulated.

FIG. 3 omits detailed explanations by allocating the same number on the identical functional members as FIG. 1. And in FIG. 3, the group number 40 represents the bobbin for the superconducting coil, 34a represents the metal layer that electrically connects various surfaces of the superconducting layer 33. The intermediate layer 32 of FIG. 1 is not shown.

In the case of a solenoid coil shown in FIG. 3(a), the magnetic flux line formed in the coil takes a form as shown by the arrows A in the same figure, and at the upper and lower part of the coil axis direction, the magnetic flux line A1 and A2 acting upon each superconducting layer 33 are directed respectively in the reverse directions. Therefore, when a superconducting wire wound a turn in the radial direction of the coil is, as shown in FIGS. 3(b) and 3(c), deployed and shown in the plane level, the perpendicular interlinkage magnetic flux acting among the conductor elements 30 of the parallel conductors due to the distribution of the magnetic field generated by the superconducting coil acts to cancel each other for the whole of the superconducting wires based on the symmetry in the axis direction of the superconducting coil, and therefore A.C. loss based on the perpendicular magnetic field is contained.

However, when various conductor elements are electrically connected as in the comparative example shown in FIG. 3(b), due to the magnetic flux A shown in FIG. 3(a), shielding current shown by the arrows B in FIG. 3(b) flows, and as a result the effect of slitting disappears and the A.C. loss cannot be reduced. On the other hand, when the same conductor elements are electrically insulated as shown in FIG. 3(c) as an embodiment of the present invention, due to the absence of route for the circulation of the shielding current, the split superconducting layers can behave respectively as independent filaments, and therefore it becomes possible to reduce the A.C. loss.

Based on a superconducting strand, for example, 9 mm wide and 0.1 mm thick, a coil is made by splitting the strand into three parts, making 30 turns in the coil axis direction and winding 12 times in the radial direction leaving the coil internal radius of 40 mm. For this coil, we calculated shunt current ratio. As a result, the shunt current ratio for each current divided into three parts was respectively 0.3398, 0.3203 and 0.3399, being quite close to equal value of 0.3333. Therefore, it was confirmed that additional loss diminished.

Thus, it is possible to make the distribution of current uniform and to reduce A.C. loss by electrically splitting and winding the superconducting layer. It should be noted that this invention is applicable to all the winding methods of coil including the pancake winding method, the cylinder winding method, the saddleback winding method, etc. And the adoption of a coil structure having at least partially a part where the perpendicular interlinkage magnetic flux acting among various conductor elements of the parallel conductors due to the distribution of magnetic field generated by the superconducting coil acts to cancel each other enables to obtain the effect of the present invention in response to the structure. The structure, action and effect of the coil will be discussed in details below with reference to the specific examples of the cylinder winding method and the pancake winding method.

We will begin our discussions on the cylinder winding method with reference to FIG. 4. The superconducting coil shown in FIG. 4 is made by winding for a plurality of turns in the coil axis direction the superconducting wire 50, and winding the same in the coil radial direction for a plurality of layers, and cooling pipes 20 are arranged between the various layers. It should be noted in addition that, in FIG. 4, 54 represents a coil flange, and 55 represents a bobbin. Furthermore, 50a, 50b and 50c represent electric connection part for superconducting wires shown for the convenience of description.

In the meanwhile, the electrical connection part includes, as described above, a bundled connection method for superconducting wires wherein various conductor elements of the parallel conductors of the superconducting wires are connected in a bundle and the separate connection method for conductor elements wherein various conductor elements of the parallel conductors are electrically separately connected respectively. Each method will be described with reference to FIG. 5.

FIG. 5(a) is a typical top plan view for describing the separate connection method for conductor elements, FIG. 5(b) is a typical top plan view for describing the bundled connection method for superconducting wires, FIG. 5(c) is common typical cross-sectional view as seen along the lines A-A and B-B in FIGS. 5(a) and 5(b). In FIG. 5, the members having the identical functions as the members shown in FIG. 1 are allocated the same numbers and their detailed descriptions are omitted.

In the case of the separate connection method for conductor elements shown in FIG. 5(a), two superconducting wires 100a and 100b are connected with various conductor elements 30 being connected respectively by the conductor elements connecting members 70, and various conductor elements 30 being connected electrically separately. It should be noted in addition that the electrical connections are by means of, for example, soldering 75 as shown in FIG. 5(c).

In the case of the bundled connection method of superconducting wires shown in FIG. 5(b), on the other hand, various conductor elements 30 of two superconducting wires 100a and 100b are respectively electrically connected with the bundled connecting member for superconducting wires 80, and the connecting member 80 constitutes an electrode part connected across the board with four conductor elements 30.

Therefore, for example, when there is an electric connecting part of the superconducting wires at 50a and 50c of FIG. 4 and when the electrical connection is made by the bundled connection method of superconducting conductors, the part where the perpendicular interlinkage magnetic flux acts to cancel mutually is partial and cannot extend to the whole superconducting wires constituting the superconducting coil as shown in FIG. 3(c). In this case, it is preferable to adopt a structure in which the parts where the perpendicular interlinkage magnetic flux acts cancel mutually would be as many as possible even when there is an electrical connection part. And for that purpose, it is preferable to fix the electrical connection part at the coil axis end as shown by 50a and 50b in FIG. 4. When the electrical connection is made by the separate connection method of conductor elements, on the other hand, the perpendicular interlinkage magnetic flux will be cancelled across the board as shown in FIG. 3(c), even if an electrical connection part is installed at 50c in FIG. 4, it is not necessary to set up an electrical connection part at the coil axis end.

And now the arrangement of a superconducting coil according to the cylinder winding method will be discussed with reference to FIG. 6. FIGS. 6(a), (b) and (c) show respectively examples of arrangement of a plurality of cylinder-shaped superconducting coils (60a-60d). For the disposition of superconducting coils, from the viewpoint of setting up as many parts as possible where the perpendicular interlinkage magnetic flux acting among various conductor elements of the parallel conductors may act to cancel each other, depending on the distribution of the magnetic field generated by the superconducting coils, an arrangement or arrangements affording symmetry in the coil axis direction, in other words, the dispositions of FIGS. 6(b) and 6(c) are preferable. In the case of FIG. 6(a), the superconducting coils 60a and 60b become asymmetric in the vertical direction in terms of the distribution of the magnetic field, and therefore A.C. loss will be greater than the case shown in FIG. 6(b). The same thing can be said when there are a large number of coils, and FIG. 6(c) shows the case where there are four coils.

And now, the case of a coil according to the pancake winding method will be explained with reference to FIGS. 7 and 9. We will begin with FIG. 9. FIG. 9 shows the typical structure of a superconducting coil according to the conventional pancake winding method and the distribution of the magnetic field thereof. The pancake winding method shown in FIG. 9 includes the step of laminating through an electric insulating material 9 in the axial direction of the bobbin 4 pancake coils made by winding concentrically a superconducting tape and the step of electrically connecting the contiguous pancake coils through a coil connecting part 8 fixed on the peripheral part of the pancake, and multi-layered coils are formed on a bobbin. In this case, the electrical connection through the coil connecting part 8 is normally made by the bundled connection method of superconducting wires.

The superconducting coil shown in FIG. 9 generates magnetic flux typically shown by the magnetic lines of force 3. Specifically, at the center of the coil axis, magnetic flux develops mainly in the axial direction or in the direction parallel to the width plane of the tape conductor. Of this, at the center of the coil lamination direction, only the component in the axial direction remains, and the absolute value of magnetic flux density will become the maximum at the inscribed part of the bobbin 4 of the tape conductor marked A in the figure. Since magnetic flux dissipates as the coordinate moves from the center inside the coil towards the end in the axial direction, the absolute value of magnetic flux density decreases. On the other hand, as the coordinate separates itself from the central axis, large magnetic flux develops in the diametral direction, or in the direction perpendicular to the width plane of the tape conductor. In particular at the winding located at the position B at both ends in the lamination direction, the component perpendicular to the width plane grows large.

Therefore, as stated above, when a coil connection part is set up between the peripheral surfaces of two neighboring coil pancakes, interlinkage magnetic flux cannot be cancelled mutually. Therefore, it is desirable to set up a coil connection part as described in the invention of claim 8 above. We will explain on this point with reference to FIG. 7.

FIG. 7 maintains the same structure as that of the superconducting coil shown in FIG. 9, and shows that the coil connection part 8 follows the conventional method of FIG. 9 for to the convenience of explanation. In FIG. 7, part numbers Ao-Fo and Ai-Fi show respectively the coil connection part on the peripheral part and the coil connection part on the internal surface of each pancake coil.

In the case of conventional pancake coils shown in FIG. 9, from Ao up to Fo, connections are made in the order shown below: Ao-Ai-Bi-Bo-Co-Ci-Di-Do-Eo-Ei-Fi-Fo. In this case, as stated above, interlinkage magnetic flux cannot be mutually cancelled.

On the other hand, the connection examples of the present invention are same as the following three examples. When the electrical connections between various pancake coils are made entirely by the separate connection method among the conductor elements, to put it in simple words, like the solenoid coils mentioned above, it is possible to connect with a single stroke of the keyboard. In other words, in FIG. 7 it is possible to connect in the order of Ao-Ai-Bi-Bo-Co-Ci-Di-Do-Eo-Ei-Fi-Fo.

Then, the case of setting up the bundled connection method for the superconducting wires at some of the connecting parts will be explained by taking up two types of examples. To begin with, the first method is to classify the pancake coils shown in FIG. 7 into three pairs of pancake coils by pairing vertically symmetrical two coils. And within each pair, the pancake coils are connected by the separate connection method for the conductor elements, and various pairs are connected by the bundled connection method for the superconductor wires.

In other words, in FIG. 7, Ao-Ai-Fi-Fo are connected successively by the separate connection method for the conductor elements, and the same principle applies to Bo-Bi-Ei-Eo and Co-Ci-Di-Do. And between Fo and Bo as well as between Eo and Co, the bundled connection method for the superconductor wires is applied. When the separate connection method for the conductor elements is represented by -, and the bundled connection method for the superconducting conductor is represented by =, the whole connection will be represented by Ao-Ai-Fi-Fo=Bo-Bi-Ei-Eo=Co-Ci-Di-Do.

Likewise, the following connection system different from the one shown above can be adopted. Namely, Ao-Ai-Bi-Bo-Eo-Ei-Fi-Fo=Co-Ci-Di-Do. According to the connection system described above, as FIG. 9 shows clearly, the interlinkage magnetic flux of the perpendicular magnetic field cancels each other based on the symmetry in the axial direction of the magnetic line of force between pancake coils.

Specifically, as described in claim 8, in the case of a coil of which the superconducting coil is one of the pancake winding style, it is preferable to set up a plurality of coil connecting parts for connecting two pancake coils on the inside and outside periphery of the coil, and at least a part of the coil connecting parts should be of the separate connection system for the conductor elements by which various conductor elements of parallel conductors of the superconducting wires are connected electrically separately, and the remaining coil connecting parts should be of the bundled connection system for the superconducting wires, and the coil connection part should be preferably set up on the inside and outside periphery of the coil so that the interlinkage magnetic flux of the perpendicular magnetic field acting among various conductor elements of the parallel conductors of various pancake coils would cancel each other on the whole.

It should be noted that, although FIG. 7 shows the case in which there are six pancake coils, in case the number of such coils changes, it is necessary to design a coil connection structure ensuring that the interlinkage magnetic flux would cancel each other depending on the number of coils. And although FIG. 6 above showed an example of arranging a cylinder-shaped superconducting coil, in the case of adopting a toroidal arrangement, a same effect can be obtained by the application of the superconducting coil of the present invention. FIG. 8 shows the case of arranging toroidally a plurality of superconducting coils to form a single system. Superconducting coils 60a-60f are arranged in such a way that the center of each coil may be at a circumferential position that would allow each of them to have a prescribed toroidal radius. Generally, these superconducting coils are operated in such a way that, from the viewpoint of electromagnetic force, symmetry may be achieved in the distribution of magnetic field. In this case, as the perpendicular interlinkage magnetic flux acting among various conductor elements of the parallel conductors behave in the same way as during the operation of a single coil, it is possible to reduce A.C. loss even in the case of toroidal arrangement by applying the coil according to the present invention irrespective of whether the cylinder winding method or the pancake winding method is used for the coil system. This statement remains valid even if the number of coils arranged changes.

INDUSTRIAL APPLICABILITY

As described above, according to the present invention, when tape-shaped superconducting wires are made by forming a superconducting film on the substrate, at least the superconducting film part is electrically separated into a plurality of superconducting film parts having respectively a rectangular cross section and arranged in parallel to form parallel conductors.

And as superconducting coils consisting of wound superconducting wires described above, in view of their structure and arrangement, a coil structure containing at least partially a part wherein the perpendicular interlinkage magnetic flux acting among various conductor elements of the parallel conductors by the distribution of the magnetic field generated by the superconducting coils act to cancel each other is provided.

By these means, it is possible to provide superconducting wires capable of suppressing the A.C. loss, and the superconducting coils consisting of these superconducting wires is, by their simple structure without transposition, structured in such a way that the interlinkage magnetic flux by the perpendicular magnetic field against the wires can be cancelled, and in addition can suppress the circulating current within the wires by the perpendicular magnetic field and thus make the shunt current uniform. By these means, it is possible to provide a low-loss superconducting coil. Furthermore, in the case of a superconducting coil with a plurality of layers of wires wound around, cooling plates consisting of a thermal conductive material are inserted among at least a part of the layers, and by cooling the superconducting wires as evenly as possible, it is possible to improve the thermal stability of the superconducting coil.

The invention claimed is:
1. Tape-shaped superconducting wires, comprising:
   a substrate;
   a plurality of electrically separated superconducting films on said substrate, the superconducting films each having a rectangular cross section and arranged in parallel to form parallel conductors; and
   a plurality of non-superconducting conducting metallic layers, each one of said metallic layers on one of said parallel conductors, each one of said metallic layers electrically separate from a remainder of said metallic layers, and each one of said metallic layers being in parallel with the remainder of said metallic layers and said parallel conductors.

2. Superconducting wires according to claim 1, wherein said superconducting film is a high-temperature superconducting film.

3. Superconducting wires according to claim 1,
   wherein the parallel conductors are electrically separated by slit-shaped grooves between each of the parallel conductors, the slit-shaped grooves being filled with electrically insulating materials, and
   wherein an entire environment around said parallel conductors is coated with the electrically insulating materials.

4. A superconducting coil wound of the superconducting wires according to claim 1, the coil comprising:
   a bobbin; and
   a coil structure of said tape-shaped superconducting wires wound around said bobbin,
   wherein perpendicular interlinkage magnetic fluxes, acting among conductor elements of said parallel conductors by a distribution of magnetic fields generated by the superconducting wires of said coil structure, cancel each other.

5. The superconducting coil according to claim 4, wherein said superconducting wires are i) wound one or more turns in a coil axis direction, and ii) wound as one or more coil layers in a radial direction of said coil structure.

6. The superconductor coil according to claim 4, wherein,
   said coil structure comprises said tape-shaped superconducting wires wound around said bobbin in a plurality of coil layers, and
   cooling plates comprising thermal conductive materials are inserted among at least some of said coil layers.

7. Tape-shaped superconducting wires, comprising:
   a substrate; and
   a superconducting film layer on said substrate,
   wherein the superconducting film layer comprises a plurality of electrically separated superconducting films with a rectangular cross section and arranged in parallel to form parallel conductors,
   wherein the superconducting film layer on the substrate has slit-shaped grooves between each of the parallel conductors, the slit-shaped grooves being filled with electrically insulating materials, and
   wherein an entire environment around said parallel conductors is coated with the electrically insulating materials.

8. Superconducting wires according to claim 7, wherein said superconducting film layer comprises a high-temperature superconducting film.

9. A superconducting coil wound of the superconducting wires according to claim 7, the coil comprising:
   a bobbin; and
   a coil structure of said tape-shaped superconducting wires wound around said bobbin,
   wherein perpendicular interlinkage magnetic fluxes, acting among conductor elements of said parallel conductors by a distribution of magnetic fields generated by the superconducting wires of the coil structure, cancel each other.

10. The superconducting coil according to claim 9, wherein said superconducting wires are i) wound one or more turns in a coil axis direction, and ii) wound as one or more coil layers in a radial direction of said coil structure.

11. The superconductor coil according to claim 9, wherein,
    said coil structure comprises said tape-shaped superconducting wires wound around said bobbin in a plurality of coil layers, and
    cooling plates comprising thermal conductive materials are inserted among at least some of said coil layers.

12. A superconducting coil, the coil comprising:

a bobbin;

tape-shaped superconducting wires coiled as a coil structure in a cylinder winding form around said bobbin, said superconducting wires comprising i) a substrate and ii) a plurality of electrically separated superconducting films on said substrate, the superconducting films each having a rectangular cross section and arranged in parallel to form parallel conductors; and an electric connecting part at a coil axis end of said coil structure, said connecting part provided in a bundled connection form for connecting conductor elements of the parallel conductors of said superconducting wires as a bundle, wherein said superconducting wires are wound i) one or more turns in a coil axis direction and ii) in one or more layers in a radial direction of said coil structure, and wherein said coil structure contains a part wherein perpendicular interlinkage magnetic fluxes, acting among various conductor elements of said parallel conductors by a distribution of magnetic fields generated by the superconducting coil, cancel each other.

13. The superconductor coil according to claim 12, wherein the coil structure has a plurality of coil layers, and cooling plates comprising thermal conductive materials are inserted among at least some of said coil layers.

* * * * *